(12) United States Patent
Geballe et al.

(10) Patent No.: US 9,865,789 B2
(45) Date of Patent: Jan. 9, 2018

(54) DEVICE AND METHOD FOR THERMOELECTRONIC ENERGY CONVERSION

(75) Inventors: Theodore Geballe, Woodside, CA (US); Stefan Meir, Friedberg (DE); Cyril Stephanos, Berlin (DE); Andreas Schmehl, Deiningen (DE); Jochen Mannhart, Boeblingen (DE)

(73) Assignees: Max-Planck-Gesellschaft zur Foerderung der Wissenschaften e. V., Munich (DE); Universitaet Augsburg, Augsburg (DE); The Board of Trustees of the Leland Stanford Junior University, Palo Alto, CA (US)

( * ) Notice: Subject to any disclaimer, the term of this patent is extended or adjusted under 35 U.S.C. 154(b) by 377 days.

(21) Appl. No.: 14/418,917

(22) PCT Filed: Jul. 30, 2012

(86) PCT No.: PCT/EP2012/003241
§ 371 (c)(1),
(2), (4) Date: May 12, 2015

(87) PCT Pub. No.: WO2014/019594
PCT Pub. Date: Feb. 6, 2014

(65) Prior Publication Data
US 2015/0243867 A1     Aug. 27, 2015

(51) Int. Cl.
*H01L 35/04* (2006.01)
*H01L 35/32* (2006.01)
*H01J 45/00* (2006.01)

(52) U.S. Cl.
CPC .............. *H01L 35/04* (2013.01); *H01J 45/00* (2013.01); *H01L 35/32* (2013.01)

(58) Field of Classification Search
CPC ........... H01L 35/04; H01L 35/32; H01J 45/00
(Continued)

(56) References Cited

U.S. PATENT DOCUMENTS

| 3,254,244 A | 5/1966 | Gottlieb et al. | |
| 3,267,307 A * | 8/1966 | Fox .......................... | H01J 45/00 310/306 |

(Continued)

FOREIGN PATENT DOCUMENTS

| CN | 1820381 A | 8/2006 |
| JP | 2005116736 A | 4/2005 |

OTHER PUBLICATIONS

English language abstract for JP 2005116736 A (2005).
(Continued)

*Primary Examiner* — John K Kim
(74) *Attorney, Agent, or Firm* — Caesar Rivise, PC

(57) ABSTRACT

A thermoelectronic energy converter device (100) comprises an electron emitter (11) being adapted for a temperature-dependent release of electrons (1), an electron collector (21) being adapted for collecting the electrons (1), wherein the electron collector (21) is spaced from the electron emitter (11) by an evacuated gap (2), a gate electrode (31) being arranged between the electron emitter (11) and the electron collector (21) for subjecting the electrons (1) in the gap (2) to an accelerating electric potential, wherein the gate electrode (31) has a plurality of electrode openings (34) being arranged for transmitting electrons (1) miming from the electron emitter (11) to the electron collector (21), and a magnetic field device (50) being arranged for creating a magnetic field with magnetic field lines extending between the electron emitter and the electron collector (11, 21), wherein the magnetic field device (50) is arranged such that at least a portion of the magnetic field lines pass through the electrode openings (34). Furthermore, a method of convert-
(Continued)

ing energy using the thermoelectronic energy converter device (100) is described.

40 Claims, 4 Drawing Sheets

(58) Field of Classification Search
USPC .................. 310/300, 306; 445/67; 136/205
IPC ............................................. H01L 35/04,35/32
See application file for complete search history.

(56) References Cited

U.S. PATENT DOCUMENTS

| | | | |
|---|---|---|---|
| 3,477,012 A | 11/1969 | Laing | |
| 6,313,391 B1* | 11/2001 | Abbott | F24J 2/34 136/200 |
| 7,003,962 B2 | 2/2006 | Deguchi et al. | |
| 2003/0029172 A1 | 2/2003 | Suthoff | |
| 2005/0134167 A1 | 6/2005 | Deguchi et al. | |
| 2006/0207643 A1* | 9/2006 | Weaver, Jr. | H01L 35/32 136/205 |
| 2008/0197747 A1* | 8/2008 | Rasor | H01J 45/00 310/306 |
| 2011/0148248 A1* | 6/2011 | Landa | H01J 45/00 310/306 |
| 2011/0298333 A1* | 12/2011 | Pilon | H01L 37/02 310/306 |
| 2015/0243867 A1* | 8/2015 | Geballe | H01J 45/00 136/205 |

OTHER PUBLICATIONS

Deng et al., "Recent advances in direct solar thermal power generation", J. Renewable Sustainable Energy 1(5), 052701 (2009).
Hatsopoulos et al., "Thermionic Energy Conversion, vol. 1: Processes and Devices", The MIT Press, pp. 5-12 (1973).
Hatsopoulos et al., "Thermionic Energy Conversion—vol. 2: Theory, Technology, and Application", The MIT Press, pp. 491-493 (1979).
Ingold, "Calculation of the Maximum Efficiency of the Thermionic Converter", Journal of Applied Physics 32, pp. 769-772 (1961).
Kulcinski, "Thermionic Energy Conversion", XP055061430, pp. 1-21 (2010), Retrieved from http://fti.neep.wisc.edu/neep602/SPRING00/lecture9.pdf.
Lee et al., "Optimal emitter-collector gap for thermionic energy converters", Appl. Phys. Lett. 100, 173904 (2012).
Lovicott, "Electron Emission Thermal Energy Conversion", XP055061237; University of Missouri—Columbia (2010).
Meier et al., "Highly-efficient thermoelectronic conversion of solar energy and heat into electric power", J. Renewable Sustainable Energy 5, 043127 (2013).
Nation et al., "Advances in cold cathode physics and technology", Proceedings of the IEEE 87(5), pp. 865-889 (1999).
Rasor et al., "Thermionic Converters for Compact Nuclear Power Plants", Atomics International, Canoga Park (1962).
Schwede et al., "Photon-enhanced thermionic emission for solar concentrator systems", Nature Materials, vol. 9, pp. 762-767 (2010).
Smestad, "Conversion of heat and light simultaneously using a vacuum photodiode and the thermionic and photoelectric effects", Solar Energy Materials and Solar Cells 82, pp. 227-240 (2004).
Stephanos, "Thermoelectronic Power Generation from Solar Radiation and Heat", XP055061200, Universitaet Augsburg (2012), Retrieved from http://opus.bibliothek.uni-augsburg.de/opus4/files/2253/Dissertation_Stephanos.pdf.
International Search Report for PCT/EP2012/003241 dated Jul. 1, 2013.
Fisher et al. (2002). Thermal and electrical energy transport and conversion in nanoscale electron field emission processes. Journal of Heat Transfer, 124(5), 954-962.
Moyzhes et al. (2005). The thermionic energy converter as a topping cycle for more efficient heat engines—new triode designs with a longitudinal magnetic field. Journal of Physics D: Applied Physics, 38(5), 782-786.

* cited by examiner

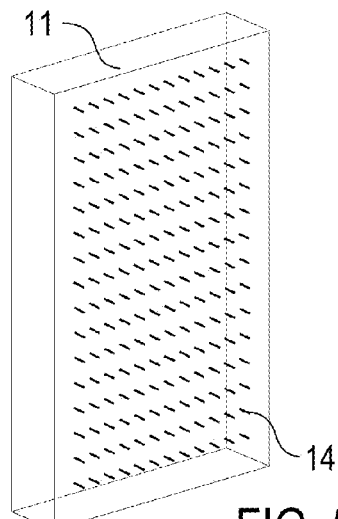
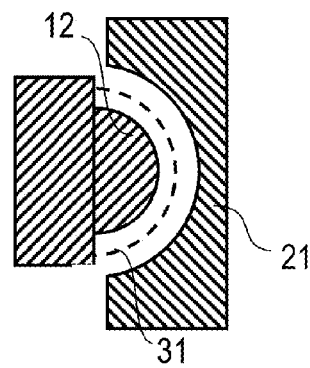
FIG. 5A  FIG. 5B
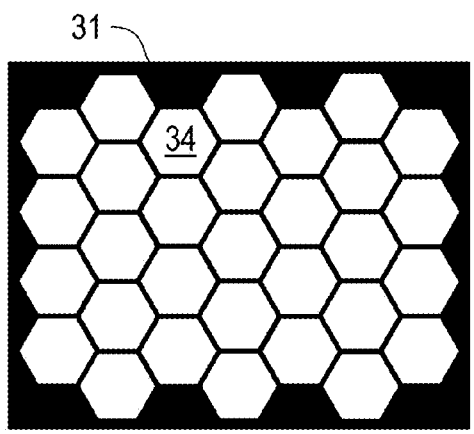
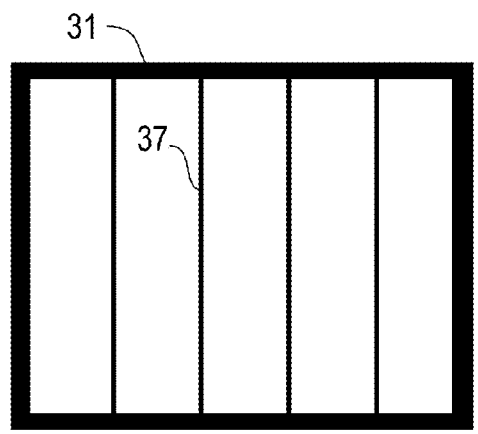
FIG. 6A  FIG. 6B
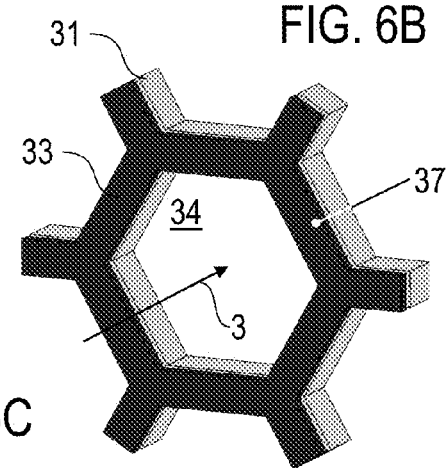
FIG. 6C

DEVICE AND METHOD FOR THERMOELECTRONIC ENERGY CONVERSION

BACKGROUND OF THE INVENTION

The invention relates to a thermoelectronic energy converter device having an emitter electrode, which is capable of emitting electrons in response to an application of thermal energy, and a collector electrode, which is capable of collecting the emitted electrons. In particular, the invention relates to a thermoelectronic energy converter device being configured as a power source converting heat into a consumable electric current or as a heat sink (or heat source) device converting electric energy into heat. Furthermore, the present invention relates to a method of thermoelectronic energy conversion of thermal energy to electric energy or vice versa, wherein the thermoelectronic energy converter device is used. Applications of the invention are available in the field of generating electric power, in particular on the basis of solar energy or thermal energy from nuclear reactions, or in the field of cooling or heating devices.

Thermoelectronic generators, which produce electric power directly from a temperature gradient are generally known as sources of electricity provided from solar energy (see e.g. Y. G. Yeng et al. in "Journal of Renewable and Sustainable Energy", Vol. 1, 2009, p. 052701; G. P. Smestad in "Solar Energy Materials and Solar Cells", Vol. 82, 2004, p. 227; J. W. Schwede et al. in "Nature Materials", Vol. 9, 2010, p. 762; and U.S. Pat. No. 6,313,391) or nuclear decay (see e.g. N. S. Rasor et al. in "Atomics International", Canoga Park, 1962). These generators—in the literature usually referred to as thermionic generators—produce the electric power directly from a temperature difference between an electron emitter and an electron collector, which are spaced by an evacuated gap. By applying thermal energy, e.g. focused solar radiation, the temperature of the electron emitter is increased so that electrons having an energy above the work function of the electron emitter material can be released into the free space. The emitted electrons travel through the evacuated gap to the electron collector, which is operated at a temperature lower than the electron emitter temperature. The electrons condense on the electron collector, and the electron collector becomes negatively charged with respect to the electron emitter. Accordingly, the thermoelectronic generator can act as a source of electric power, which can be harvested e.g. by connecting the electron emitter and the electron collector through a load circuit. Because thermoelectronic generators can in principle be operated at very high temperatures, e.g. emitter temperatures above 1500° C., with very large temperature differences between the electron emitter and the electron collector, and because heat loss can in principle be very small, high conversion efficiencies have been predicted for the thermoelectronic generators in the literature (see e.g. J. H. Ingold in "Journal of Applied Physics", Vol. 32, 1961, p. 769).

As a general problem, the emission of electrons from the electron emitter is usually limited by space charges, which are built-up near the electron emitter surface. The released electrons form an electron cloud, thus providing a barrier against the emission of further electrons. These space charges drastically limit the current of emitted electrons and therefore the power generated by the thermoelectronic generator. Conventionally, three techniques have been developed for suppressing the space charge effects.

Firstly, it has been realized to decrease or even neutralize the space charge cloud by an injection of positively charged ions, like e.g. Cs ions. However, this approach has essential drawbacks. The ions have to be generated in a power consuming process. Furthermore, the ions have to be injected into the space charge region at a desired density, while chemical reactions and a condensation of the ions at undesirable positions have to be avoided. As a further disadvantage, for ensuring a long lifetime of the generator, the ions have to be recycled. Finally, energy is lost by undesired electron-ion collisions and heat transport by ion gas.

As an example of the first approach, U.S. Pat. No. 3,267,307 discloses a thermionic generator using Cs ions decreasing the space charge cloud. For reducing the heat transport, a permeable heat shield is provided in the Cs vapor filled gap between the emitter to the collector. The heat shield has a complex tube or foil structure being made of conducting and insulating materials and including openings through which electrons travel from the emitter to the collector. A magnetic field is provided for concentrating the electrons along paths through the openings. For avoiding a deposition of Cs ions on the heat shield, a small bias voltage is applied to the heat shield.

According to a second approach, emitted electrons are accelerated by an electric field, which is created by an additional electrode (anode or acceleration electrode). A positive voltage is applied to the anode, so that electrons are accelerated out of the space charge cloud. As an example of the second approach, U.S. Pat. No. 3,477,012 discloses a thermoelectronic generator with a coaxial structure having a central emitter rod surrounded by a hollow cylindrical anode and an outer cylindrical collector. By the effect of a magnetic field, electrons released from the emitter and accelerated to the anode are deflected to an exposed inner surface of the collector. Although the gap between the emitter and the collector is evacuated and the use of Cs ions can theoretically be avoided with this technique, there are disadvantages in terms of the complex structure, restricted scalability and limited energy conversion efficiency of the conventional thermoelectronic generator. Since the electric field and the trajectories of the electrons along the magnetic field lines are perpendicular, the electric field does not accelerate electrons towards the collector. Hence, it does not decrease the space charge, which leads to small efficiencies.

It is also known that acceleration electrodes are used in science and technology on a regular basis. One such usage, the experimental investigations of the electron release at the emitter with local resolution, has been described by George N. Hatsopoulos in "Thermionic energy conversion" (vol. 2, U.S. Dept. of Energy, 1979, p. 491 to 493). This acceleration electrode is a plane plate being arranged between the emitter and the collector and having one aperture through which electrons can pass. An efficient energy conversion was excluded with this experimental set-up.

A third approach is based on the fabrication of the generator with emitter-collector distances too small for space charges to form (see e.g. J.-H. Lee et al. in "Appl. Phys. Lett." vol. 100, 2012, p. 173904). This is usually referred to as "close-space-technique". However, this concept has a serious drawback in terms of the necessary stabilization of practically large area electron emitter and electron collector surfaces at large temperature differences with a precision of micrometers or fractions thereof. The stabilized emitter-collector distance in particular has to be kept constant during eventual thermal expansions of the components. Today it is expected that the only concept for avoiding this drawback is the above Cs ion based first approach as mentioned by J.-H. Lee et al. in 2012.

Despite of the drawbacks of the conventional techniques, thermoelectronic generators have been used in several Russian space crafts, wherein the electron emitter has been heated with radioisotopes and the space charge has been suppressed by the above Cs approach. On the other hand, the close-space-technique has never been industrially applied.

The objective of the invention is to provide an improved thermoelectronic energy converter device and an improved method of thermoelectronic energy conversion, respectively, wherein disadvantages and limitations of conventional techniques are avoided. In particular, the thermoelectronic energy conversion is to be obtained with increased efficiency, improved reliability and/or reduced complexity of the device structure.

These objectives are solved with a thermoelectronic energy converter device and a method for thermoelectronic energy conversion of the invention.

DESCRIPTION OF THE INVENTION

According to a first aspect of the invention, a thermoelectronic energy converter device is provided, which comprises an electron emitter being adapted for releasing (emitting) electrons in response to an application of thermal energy, and an electron collector being adapted for collecting the electrons released by the electron emitter. The electron collector is arranged such that the emitted electrons can condense at the electron collector. The electron emitter and the electron collector are arranged with a mutual spacing providing an evacuated gap therebetween. A vacuum is in the gap, which is free of ions or other gas or vapor. The thermoelectronic energy converter device further comprises an accelerating electrode (gate electrode), which is capable of subjecting the electrons traveling between the electron emitter and the electron collector to an accelerating electric potential. The accelerating electrode is arranged with a lateral extension along the extension of the electron emitter and collector surfaces. The accelerating electric potential can be created e.g. in response to the application of a positive voltage relative to the electron emitter or as a result of work functions difference between the electron emitter and the accelerating electrode. Furthermore, the thermoelectronic energy converter device comprises a magnetic field device which is configured for providing a magnetic field between the electron emitter and the electron collector. In particular, the magnetic field device is adapted for creating the magnetic field with magnetic field lines extending between the electron emitter and the electron collector.

According to the invention, the accelerating electrode has a plurality of electrode openings being arranged for transmitting the electrons released from the electron emitter and running to the electron collector. The electrons are gated through the accelerating electrode. Therefore, it is also called gate electrode. As a further feature of the invention, the magnetic field device is arranged such that the magnetic field at least partially extends through the electrode openings. In particular, the magnetic field device is adapted for providing at least a portion of the magnetic field lines passing through the electrode openings. The magnetic field lines extend through the evacuated space such that the electrons are directed along electron paths through the electrode openings of the gate electrode.

Contrary to U.S. Pat. No. 3,267,307, the inventive thermoelectronic energy converter device works without Cs ions in the gap and uses the applied voltage to accelerate electrons. Thus, with the evacuated gap and the at least one gate electrode, the invention belongs to the second of the above conventional approaches. Furthermore, contrary to the conventional technique of U.S. Pat. No. 3,477,012, the electrons do not pass next to the gate electrode, but through the gate electrode. The gate electrode preferably provides a complete or predominant coverage of the gap between the electron emitter and the electron collector in a lateral direction. Thus, structural limitations can be avoided and the formation of an efficient magnetic field is facilitated. Furthermore, contrary to the conventional technique of Hatsopoulos, the gate electrode has the multiple electrode openings, thus allowing a passage of all or nearly all released electrons to the electron collector. The portion of released electrons reaching the collector is essentially increased compared with conventional techniques, and restrictions with regard to the efficiency of conventional techniques are avoided. The inventors have found that with the arrangement of the gate electrode with multiple electrode openings, strong and homogeneous accelerating electric fields can be obtained with low applied voltages (typically at least 1 V, and/or below 10 V).

The inventive apparatus is called a "thermoelectronic energy converter device" as it is operated on a pure electron based charge shift, while the provision of ions capable of compensating the space charge is excluded. Furthermore, the term "thermoelectronic" emphasizes the difference of the inventive apparatus over the conventional principle of thermoelectric energy conversion, wherein electrons are moved between different metals at different temperature due to thermodiffusion of electrons.

Generally, the thermoelectronic energy converter device comprises the electron emitter device and the electron collector device including the electron emitter and electron collector, respectively. The term "electron emitter" generally refers to a single component or multiple components of the electron emitter device including an electrically conductive material (typically a metal, a semiconductor, a conducting oxide, a ceramic, a diamondoid, LaB6, and/or an electride) with a surface facing towards the electron collector. On the other hand, the electron collector comprises a single component or multiple components of the electron collector device each of which being assigned to one or more of the components(s) of the electron emitter. The electron collector includes an electrically conductive material (typically a metal, a semiconductor, a conducting oxide, a ceramic, a diamondoid, a boride like e.g. LaB6, and/or an electride) having a low work function surface facing towards the evacuated gap. At least one of the electron emitter and the electron collector can be doped with a work function lowering dopand, like e.g. lanthanum oxide, and/or can be coated with a work function lowering coating, made of e.g. barium oxide or cesium. The electron emitter and the electron collector also can be called emitter electrode and collector electrode, respectively. Both of the electron emitter and electron collector preferably are made of an inert material having a low work function. Preferably, the work function of the collector material is below 1 eV, while the emitter material preferably has a work function below 3 eV. Other work functions values are possible depending on the particular conditions and requirements of using the invention.

Depending on the application of the invention, the thermoelectronic energy converter device is operated on the basis of utilizing or creating a temperature difference between the electron emitter and the electron collector. The electron emitter and the electron collector are arranged such that a temperature gradient can be created therebetween. The electron emitter is arranged for an application of thermal energy or as a heat sink. With a preferred variant, the electron emitter device is configured such that the thermal energy can be applied directly to or conducted directly from the electron emitter, e.g. by a direct irradiation with light or ionizing radiation or particle radiation. With a second variant, the electron emitter device may include a thermal energy absorber or thermal energy conductor, which is connected with the electron emitter. The thermal energy absorber or conductor may be a component, which is arranged for a direct irradiation of an absorbing region, a heating thereof and a conduction of the thermal energy to the electron emitter (or vice versa). The electron collector is arranged to be operated at a lower temperature compared with the electron emitter. The lower temperature can be simply obtained due to the fact of a thermal isolation between the electron emitter and the electron collector, in particular by the evacuated gap and surrounding support structure, like spacers. Additionally, a cooling device can be provided as outlined below.

Generally, the invention can be implemented with any positive temperature difference between the electron emitter and the electron collector. As the energy conversion efficiency is increased with the electron emitter temperature (for a fixed collector temperature), applications with an electron emitter temperature of at least 300° C., in particular at least 100° C. or even more than 1200° C. are preferred. Furthermore, the temperature difference between the electron emitter and the electron collector is preferably at least 200 degrees, in particular 100 degrees or even more than 1000 degrees on the Celsius scale. However, applications with lower temperatures are possible as well, in particular if materials with very low work functions (below 2 eV) are used and/or if the photoelectric effect is used (see J. W. Schwede et al., cited above) to utilize the photon energy of the incoming light to facilitate the emission of electrons from the emitter.

According to a second aspect of the invention, a method of energy conversion, in particular converting thermal energy to electric energy or vice versa, is provided, wherein the thermoelectronic energy converter device according to the above first aspect of the invention is used. Depending on the energy conversion direction, the electron emitter and the electron collector are arranged at different temperatures, or they are arranged for creating different temperatures. The method of thermoelectronic energy conversion comprises the steps of releasing electrons from the electron emitter into the evacuated gap, traveling of the emitted electrons from the electron emitter along magnetic field liens through the electrode openings to the electron collector and collecting (condensing) the electrons at the electron collector.

According to a preferred embodiment of the invention, the gate electrode comprises a single sheet of an electrically conducting material. Preferably the gate electrode is a single-layer shaped component extending in the evacuated gap along the surfaces of the electron emitter and the electron collector. The gate electrode may comprise a self-supporting component in the evacuated gap or may be supported by the electron collector or the electron emitter or an additional support element as outlined below.

According to a particularly preferred embodiment, the gate electrode has a lattice structure formed by electrically conductive lattice strips (rods) and the plurality of electrode openings. While there are no particular limitations with regard to the lattice geometry, a regular lattice with one- or two-dimensionally distributed lattice strips can be used in the simplest case. Deviations from a perfect periodicity will be of advantage to consider, for example, differences between the electron emission at the emitter's outer and inner areas. Using a gate electrode with a lattice structure has advantages in terms of both of mechanical stability of the gate electrode and the homogeneous creation of the accelerating electric potential.

Particular advantages for the energy conversion efficiency are obtained if the gate electrode has a honeycomb lattice structure. With a honeycomb lattice structure, an excellent aspect ratio between the area of the holes transmitting the electrons and area of the lattice strips shielding the collector electrode can be obtained.

With a further preferred variant of the invention, the electrode openings have a cross-sectional dimension being equal to or smaller than five times the width of the spacing between the electron emitter and the electron collector. Particularly preferred is an embodiment wherein the cross-sectional dimension is equal to or smaller than the width of the spacing between the electron emitter and the electron collector.

Preferably, a distance between the electron emitter and the electron collector is above 1 μm, in particular above 10 μm. Accordingly, restrictions of conventional techniques of the above third approach can be avoided, while contrary to J.-H. Lee et al. (cited above) the Cs-ion based first approach is avoided as well. Furthermore, the distance typically is below 0.5 mm, preferably below 0.3 mm, in particular below 200 μm. This allows a compact design of the inventive device and enables higher current densities for a fixed gate voltage. According to a further preferred feature, the thickness of the gate electrode is below 300 μm, in particular below 250 μm. Advantageously, this further contributes to the compact design.

According to a further advantageous embodiment of the invention, the electron collector is cooled with a cooling device. With the cooling of the electron collector, the efficiency of energy conversion can be increased. Furthermore, cooling of the electron collector allows an additional energy harvesting step. As a further advantage, various possibilities exist for designing the cooling device. As preferred examples, a passive cooling can be provided, wherein the cooling device comprises a radiator or cooling fins connected with the electron collector. Additionally or alternatively, the cooling device can be adapted for an active cooling of the electron collector, using e.g. a cooling fluid, which flows in thermal contact with the electron collector. With a further embodiment, the electron collector can be connected with a heat engine, e.g. a steam turbine, using residual heat collected at the electron collector.

According to a particularly preferred embodiment of the invention, the magnetic field device includes at least one permanent magnet and/or an electro magnet, which is arranged for creating the magnetic field in the evacuated gap. The at least one permanent magnet and/or the electro magnet is arranged adjacent to or in a neighborhood of at least one of the electron emitter and the electron collector. Particularly preferred is an embodiment using two magnets each of which being arranged adjacent to one or in a neighborhood of the electron emitter and the electron collector. Creating a permanent magnetic field has advantages in terms of magnetic field homogeneity and low operational costs.

Advantageously, the magnetic field device can include a magnetic yoke being arranged for confining the magnetic field lines. Additionally or alternatively, the magnetic field device can create an inhomogeneous magnetic field with sections of increased field strength according to the positions of the electrode openings. To this end, the magnetic field device can include at least one magnetic field shaping component, which is made of a magnetically soft, structured material. Advantageously, the magnetic field shaping component provides additional degrees of freedom for designing the electron paths from the electron emitter to the electron collector.

According to a further preferred embodiment of the invention, the gate electrode can be supported by the electron emitter or the electron collector. In particular, a direct sandwich-like support or a support using spacer elements can be provided. If the gate electrode is supported by the electron emitter, the evacuated gap predominantly or completely is formed between the gate electrode and the electron collector. Alternatively, if the gate electrode is supported by the electron collector, the evacuated gap predominantly or completely is formed between the electron emitter and the gate electrode. The gate electrode is electrically insulated relative to the electron emitter or electron collector, resp. With this embodiment, the stability of the device is essentially increased, and advantages in terms of scalability, suppression of any space charge near the electron emitter or collector and a compact structure of the inventive device are obtained. According to a further embodiment of the invention, the gate electrode can be positioned in the centre between the emitter and the collector.

As a preferred example, the gate electrode can be electrically insulated by an insulator layer on the electron emitter or electron collector, wherein the insulator layer has insulator openings aligned with the electrode openings. The electron emitter or electron collector surface is exposed at the insulator openings, so that the efficiency of electron release or collections is not diminished. Particularly preferred, the gate electrode and the insulator layer on the electron emitter or collector can be deposit coatings carried by the emitter or collector surface. The deposit coatings can be made by e.g. vapor deposition, sputtering, Pulsed Laser Deposition (PLD), or other processes for depositing thin solid films.

According to a further advantageous embodiment of the invention, the electric potential between the electron emitter and the electron collector additionally can be shaped by at least one of at least one auxiliary gate electrode and at least one shielding electrode. The at least one auxiliary gate electrode and/or the at least one shielding electrode are arranged between the electron emitter and the electron collector and have a plurality of electrode openings, which are aligned with the electrode openings of the gate electrode. According to a first variant, the auxiliary gate electrode is provided, which is adapted for creating an additional accelerating electric potential at or near the surface of the electron collector. It has been found that at the collector surface, an additional space charge can be created, the effect of which can be compensated by the auxiliary electrode.

Additionally or alternatively, the at least one shielding electrode can be provided, which is adapted for shielding a surface of the gate electrode facing to and/or away from the electron emitter. As a further alternative, the shielding electrode can be arranged for shielding inner walls of the electrode openings. Accordingly, electrons accelerated towards the gate electrodes are deflected towards the at least one hole through the gate electrode. Advantageously, this provides an additional improvement of the conversion efficiency.

As a further advantage of the invention, any limitations with regard to the geometrical shape and/or surface properties of the electron emitter can be avoided. According to a preferred implementation of the invention, the electron emitter and/or collector has a plane surface, which is exposed towards the evacuated gap. The plane surface has advantages for manufacturing the thermoelectronic generator device, e.g. as an integrated chip or cell.

Alternatively, the electron emitter and/or collector can have a curved surface, like e.g. a semi-spherical surface, which is open towards the electron collector. With this embodiment, advantages with regard to the shaping of the accelerating electric potential and with regard to a dilution of the space charge can be obtained. As a further alternative, a cylindrical electron emitter can be provided, which is surrounded in multiple directions, e.g. completely surrounded, by the electron collector shaped as a hollow cylinder.

With the embodiments utilizing curved surfaces, the shape of the gate electrode and the magnetic field are adapted to the geometry of the emitter and collector and the shape of the gap. Preferably, the gate electrode is geometrically similar to the surface shape of the electron emitter, and the magnetic field is shaped such that the magnetic field lines hit perpendicular on the curved area along the surface of the gate electrode.

According to a further modification, which can be provided with both of plane or curved emitter and/or collector surfaces, micro- and/or nano-structures can be provided on the electron emitter and/or collector surfaces. The micro- or nano-structures comprise a distribution of emitter tips having a characteristic length in the range of e.g. 1 μm to 100 μm or 10 nm to 1 μm, respectively. The surface structure is provided e.g. by micro- or nano-tubes standing on the electron emitter material. Advantageously, the surface structure creates local electric field enhancements increasing the emission probability. Particularly preferred, the tip structure distribution is formed on surface sections of at least one of the electron emitter and the electron collector only, which surface sections are aligned with the electrode openings of the gate electrode.

As a further important advantage of the invention, various alternatives exist for creating the accelerating electric potential between the electron emitter and the gate electrode. Firstly, the gate electrode can be electrically connected with a dc voltage source, like e.g. a thermoelectric source. The dc voltage source can be adapted for superimposing the dc voltage with an ac voltage modulation. Thus, the current of collected electrons can be modulated, and electric power can be created with a modulation resulting in an ac current in a load circuit. Secondly, if the work function of the material of the gate electrode is lower than the work function of the material of the electron emitter, the voltage source can be omitted. With this embodiment, the gate electrode is electrically connected with the electron emitter. The inventors have found that the work function difference is sufficient for creating a potential between the short-circuited emitter and gate electrodes, wherein this potential works as the accelerating electric potential for destroying the charge cloud at the emitter. Thirdly, both variants can be combined. If the work function of the material of the gate electrode is lower than the work function of the material of the electron emitter, and the gate electrode can be electrically connected with a dc voltage source, the accelerating effect of the work function difference is supported by the dc voltage source. In this case, the voltage source can be adapted for a lower voltage, e. g. in the range of 0.5 V to 1 V, compared with the first variant.

According to a further independent aspect of the invention, the above embodiment utilizing the work function difference between the emitter and gate electrodes for creating the accelerating potential can be provided without the provision of the magnetic field. Thus, a thermoelectronic energy converter device of the invention generally comprising an electron emitter being adapted for a temperature-dependent release of electrons, an electron collector being adapted for collecting the electrons, wherein the electron collector is spaced from the electron emitter by an evacuated gap, and a gate electrode is arranged between the electron emitter and the electron collector for subjecting the electrons in the gap to the accelerating electric potential, wherein the work function of the material of the gate electrode is lower than the work function of the material of the electron emitter and the gate electrode is electrically connected with the electron emitter.

According to further preferred embodiments of the invention, the electron collector and/or the gate electrode can carry a reflective layer which has a maximum reflectivity in wavelength ranges of visible and/or thermal radiation. The reflective layer reflects energy back to the electron emitter, thus improving the efficiency of the device.

There are two main applications of the invention, which differ with regard to the direction of energy conversion. With the power source application heat is converted into a consumable electric current. With this embodiment, the thermoelectronic energy converter device comprises a load circuit, which is connected between the electron emitter and the electron collector. The electron emitter is arranged for an application of at least one of thermal energy and radiation energy, and the thermoelectronic energy converter device is configured for converting the applied energy to electric energy. Preferably, a thermal engine can be connected with the electron collector, thus further increasing the conversion efficiency.

BRIEF DESCRIPTION OF SEVERAL VIEWS OF THE DRAWINGS

With the heat sink (or heat source) application, electric current is converted into thermal energy providing a cooling action at the electron emitter and/or a heating action at the electron collector. With this embodiment, the thermoelectronic energy converter device comprises an electric power source which is connected between the electron emitter and the electron collector. The electron emitter is arranged as the heat sink to be cooled by the release of the electrons and/or the electron collector is arranged as the heat source to be heated by the collection of the electrons. Further details and advantages of the invention are described in the following with reference to the attached drawings, which show in:

FIGS. 5A and 5B: schematic illustrations of electron emitter surfaces;

FIGS. 6A, 6B and 6C: schematic illustrations of gate electrode lattice structures used according to the invention.

DETAILED DESCRIPTION OF PREFERRED EMBODIMENTS

Figure 1:
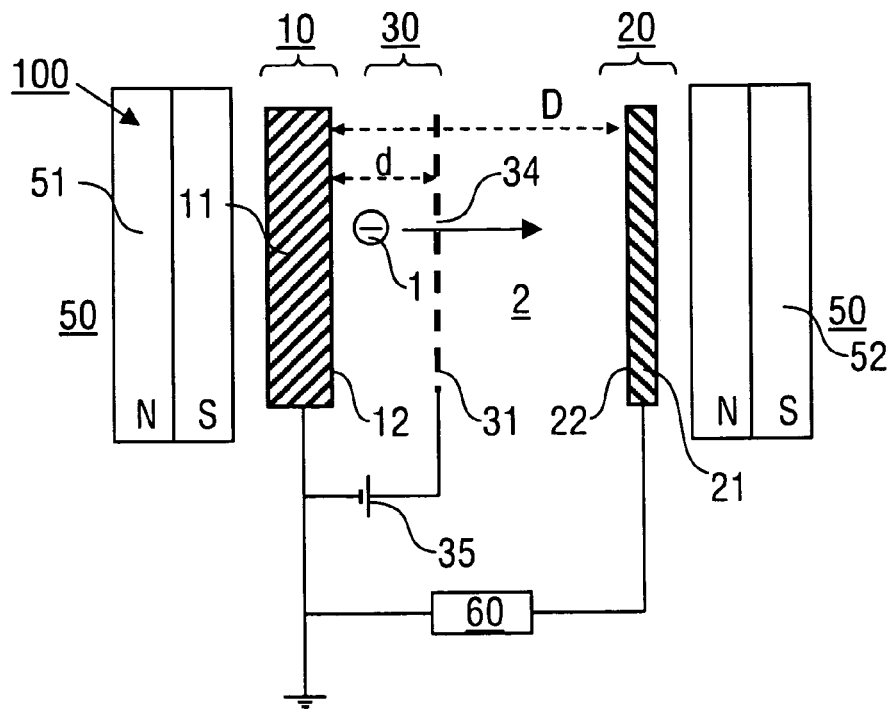
FIGS. 1 to 3: schematic illustrations of preferred embodiments of the thermoelectronic energy converter device according to the invention.

Features of preferred embodiments of the inventive thermoelectronic energy converter device and the method of thermoelectronic energy conversion are described in the following with particular reference to the provision of the gate electrode and optional further features, like e.g. the magnetic field device and shielding or auxiliary gate electrode. Furthermore, particular reference is made to the power source application of the thermoelectronic energy converter device. Features of thermoelectronic generators, like the function principle or the adaptation for applying thermal energy to the electron emitter are not described as far as they are known from conventional thermoelectronic or thermionic generators. The vacuum in the gap between the electron emitter and the electron collector of the inventive device can be provided by arranging the whole set-up in a vacuum chamber or in an evacuated enclosure (not shown). The alternative heat sink (or heat source) applications of the thermoelectronic energy converter device can be implemented in an analogue way as described, wherein a load circuit (see e. g. FIG. 1) is replaced by a power source.

Furthermore, it is emphasized that the drawings are schematic illustrations only, which do not represent scaled versions of practical devices. With practical implementations of the invention, the skilled person will be able to select geometrical dimensions, structural properties, materials and electric circuitry in dependency on the particular application requirements.

According to FIG. 1, the thermoelectronic generator device 100 comprises an electron emitter device 10, an electron collector device 20, an electrode device 30 and a load circuitry 60. The electron emitter device 10 comprises an electron emitter 11, which in this case is electrically connected with ground potential (earth potential). Additionally, the electron emitter device 10 may comprise mechanical components for holding the electron emitter 11 and/or an energy absorber device being in thermal contact with the electron emitter 11 (not shown). The electron collector device 20 comprises an electron collector 21, the surface 22 of which being arranged with a distance D from the surface 12 of the electron emitter 11. The gap 2 between the electron emitter 11 and the electron collector 21 is evacuated, as it is known from conventional thermoelectronic generators. The electron collector 21 is connected via the load circuitry 60 with the electron emitter 11 and the ground potential. The load circuitry 60 includes e.g. a load resistance, an accumulator device and/or an electric consumer device. In a practical implementation, the arrangement of the electron emitter 11 and the electron collector 21 is encapsulated by the pressure tight casing (not shown), so that the pressure in the gap 2 can be reduced below the atmospheric pressure.

The electrode device 30 comprises a gate electrode 31 and a gate voltage source 35. The gate electrode 31 is arranged in the evacuated gap 2 with a distance d from the surface 12 of the electron emitter 11. The gate electrode 31 has a plane or curved layer shape, the microstructure of its surface and possibly also the other electrodes, however, may be rough or even be characterized by a needle-like structure. In the illustrated example, both the surface 12 and the gate electrode 31 have a plane shape. The gate electrode 31 has a lattice structure, which is described with further details with reference to FIG. 6 below. It includes multiple electrode openings 34, through which traveling electrons 1 may pass from the electron emitter 11 to the electron collector 21. The gate voltage source 35 is a dc source, e.g. a conventional thermoelectric source, creating a positive voltage of the gate electrode 31 relative to the electron emitter 11.

The gate electrode 31 may comprise a component which is self-supporting by the mechanical rigidity of the electrode material as such or by an additional layer shaped support element connected with the electrode material and made of e. g. a ceramic. Alternatively, the gate electrode 31 can be supported by the electron collector device 20 or the electron emitter device 10 (see FIG. 3), using for example, techniques commonly known in thin-film technology.

Furthermore, FIG. 1 illustrates the provision of a magnetic device 50 including two permanent magnets 51, 52. The first permanent magnet 51 is arranged with the south pole S facing to the electron emitter 11, while the second permanent magnet 52 is arranged with the north pole N facing to the electron collector 21. The permanent magnets 51, 52 are made of e.g. NdFeB with a shape allowing the provision of a homogeneous magnetic field in the gap 2. In view of the alignment of the electron emitter 11 and the electron collector 21, the permanent magnets 51, 52 preferably have a size larger than the area of the electron emitter 11 and electron collector 21, thus improving the field homogeneity in the gap 2.

Figure 3:
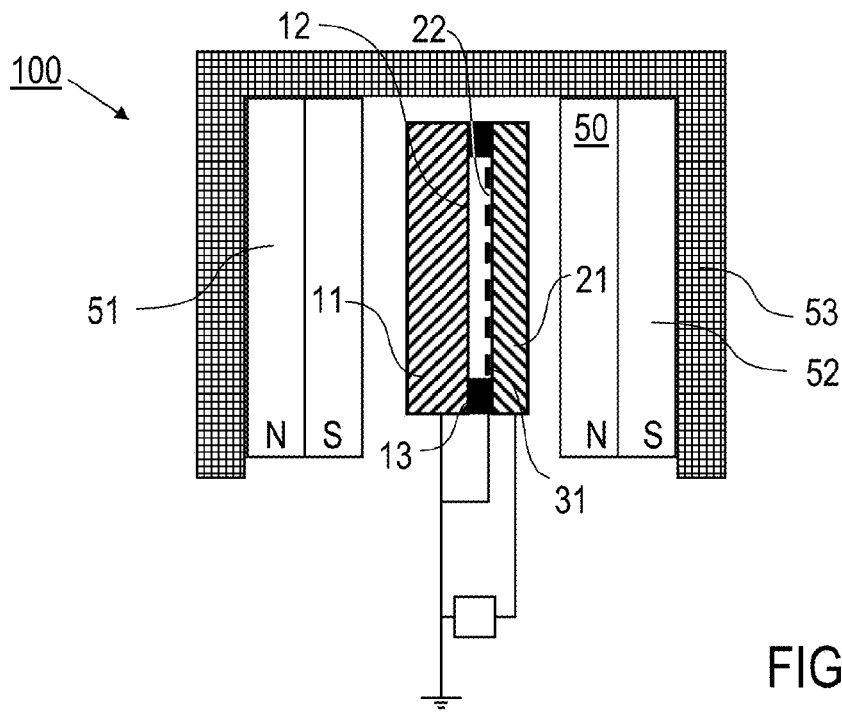
Figure 4A:
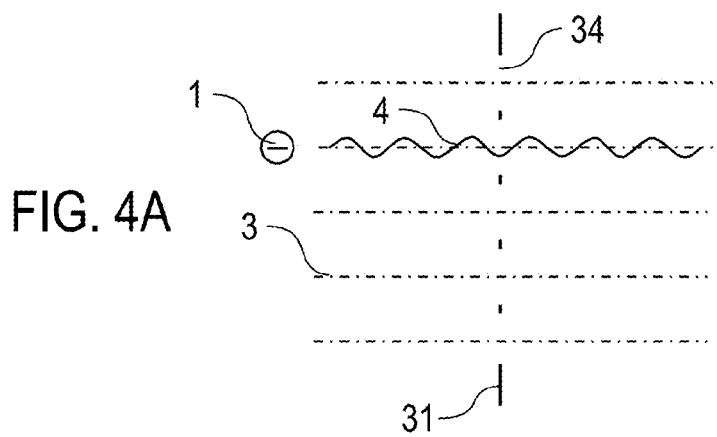
FIGS. 4A, 4B and 4C: schematic illustrations of the effect of a magnetic field and a difference of work functions in emitter and gate materials.

The effect of the magnetic field is illustrated in FIG. 4A (see below). The magnetic device 50 and the effect thereof can be modified as follows. It is not necessary that all magnetic field lines extend through the electrode openings. In practice, the predominant portion of the magnetic field lines extend through the electrode openings. The magnetic field can be concentrated by the effect of a magnetic yoke (see FIG. 3). The permanent magnets 51, 52 can be arranged with reversed field direction. Furthermore, they can be replaced by supra-conducting or normal-conducting electromagnets. Finally, an inhomogeneous magnetic field can be created, e.g. by providing permanent magnets with inhomogeneous magnetic material properties. The permanent magnets can have a surface structure creating concentrated field lines through the positions of the gate electrode openings.

In a practical example, the thermoelectronic energy converter device 100 is provided as follows. The electron emitter 11 is a plate made of tungsten doped with lanthanum oxide having a plane surface 12, which is exposed to the gap 2. The surface diameter is e.g. 5 cm to 15 cm. The exposed surface 12 has an area of e.g. 10 cm$^2$ to 100 cm$^2$. The thickness of the electron emitter 11 is e.g. 0.1 mm to 1.0 cm. The electron collector 21 is a plane plate being arranged in parallel to the electron emitter 11, wherein the distance D is selected in the range of e.g. 20 μm to 0.2 mm. The distance d between the emitter surface 12 and the gate electrode 31 is about D/2. The electron collector 21 is made of e.g. titanium/tungsten or another metal carrying a layer of a material having a low work function, like e.g. Barium oxide. Generally, the work function of the emitter is larger than that of the collector. The gate electrode 31 is made of e.g. straight lattice strips forming a rectangular matrix arrangement of rectangular lattice holes 34. The cross-sectional dimension of the lattice holes 34 is selected in the range of e.g. 10 μm to 1 mm. Typically, a cross-sectional dimension of about 100 μm is preferred. The cross-sectional dimension of the lattice strips is e.g. 1 μm to 0.1 mm. The gate electrode 31 is made of e.g. titanium or tungsten. The invention is not restricted to the above examples. The skilled person will be able to vary e.g. the geometrical and electric parameters.

For implementing the inventive energy conversion method, thermal energy is applied to the electron emitter 11, e. g. by a focused irradiation with solar energy. The electron emitter 11 is heated to a temperature of e.g. 1000° C., resuiting in the emission of electrons 1 by means of the thermal energy and possibly by the photoelectric effect into the evacuated gap 2. In practice, the temperature of the electron emitter 11 depends on the emitter material. An accelerating electric potential is created in the gap 2 by applying a positive voltage, e.g. 5 V, to the gate electrode 31. Electrons 1 emitted from the surface 12 of the electron emitter 11 are accelerated towards the electron collector 21, so that the creation of a space charge cloud is avoided. The electrons 1 travel along electron paths 3 (see arrow) through the electrode holes 34. The electron collector 21 is arranged at a lower temperature compared with the electron emitter 11, typically below 500° C., e.g. at 200° C. to 300° C. For keeping the lower temperature, a thermal insulation may be arranged in a region surrounding the gap 2 between the electron emitter 11 and the electron collector 21 and the cold surfaces may be fabricated with surfaces of high optical reflectivity. The released electrons 1 are condensed on the electron collector 21, so that an electron current is created through the load circuitry 60.

For reversed implementing the inventive energy conversion method (heat pump embodiment), electric power is supplied between the electron emitter 11 and the electron collector 21, resulting in a release of electrons from the electron emitter 11. Thermal energy is conducted from the surrounding to the electron emitter 11, resulting in a cooling effect thereof.

Figure 2:
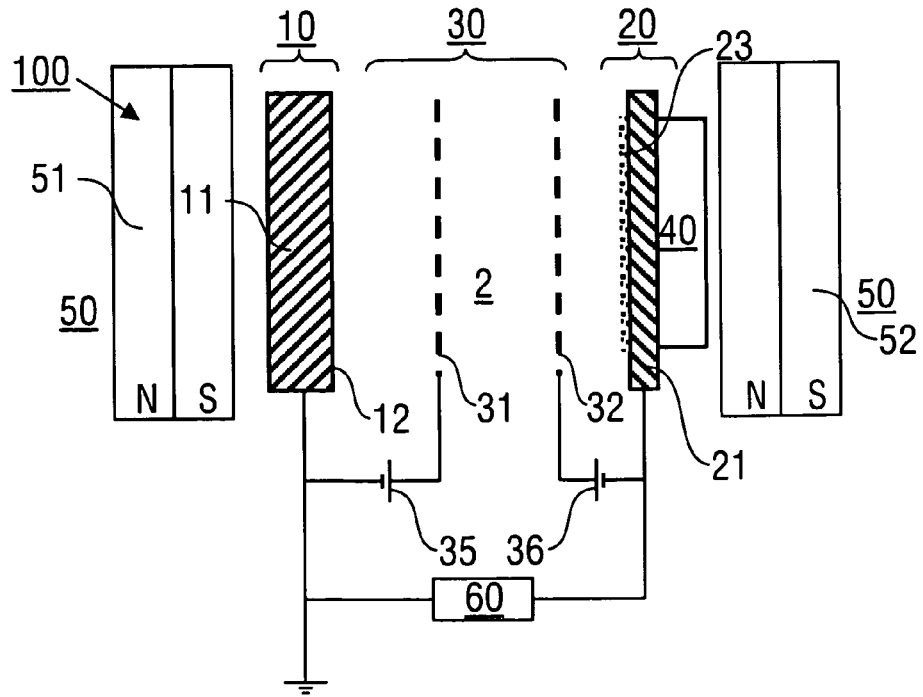

Further features of alternative embodiments of the inventive thermoelectronic energy converter device 100 are schematically illustrated in FIG. 2. With this embodiment, the electrode device 30 includes the gate electrode 31 and an auxiliary gate electrode 32. The auxiliary gate electrode 32 is arranged at or near the surface 22 of the electron collector 21. By applying a positive voltage of a dc source 36, e.g. a conventional thermoelectric source, to the auxiliary gate electrode 32 relative to the electron collector 21, electron charge effects at the surface 22 can be suppressed. The condensation process of the electrons on the electron collector 21 is supported by an accelerating electric potential. FIG. 2 further schematically illustrates a cooling device 40, which is arranged for cooling the electron collector 21. The cooling device 40 comprises e.g. an active cooling circuit using water or oil as a cooling fluid. Furthermore, FIG. 2 shows a reflective layer 23 on the surface of the electron collector 21. The reflective layer 23 provides a mirror reflecting visible and/or thermal radiation back to the electron emitter 11.

FIG. 3 illustrates further features of alternative embodiments of the inventive thermoelectronic energy converter device 100. With these embodiments, the gate electrode 31 is supported by the electron collector 21. On the surface 22 of the electrode collector 21 facing to the gap 2, an insulating layer is provided having predetermined through-holes according to the location and extension of the electrode holes of the gate electrode 31. The gate electrode 31 is arranged on the insulation layer, wherein the electrode openings are aligned with the openings in the insulation layer (not shown). Both the gate electrode 31 and the insulation layer can be provided by evaporation deposition on the collector surface 22.

Contrary to the above embodiments, FIG. 3 shows that the gate electrode 31 is electrically connected with the electron emitter 11. In this case, the accelerating potential between the electron emitter 11 and the gate electrode 31 is created by a difference of the work functions of the emitter and gate materials as further illustrated in FIGS. 4B and 4C.

FIG. 3 further illustrates that the electron emitter 11 and the electron collector 21 (with the gate electrode 31) can be manufactured as an integrated generator cell with a sandwich structure. At the outer border of the surfaces 12, 22 of the electron emitter 11 and the electron collector 21 facing to each other, a spacer 13 is arranged. Alternatively or additionally, a spacer can be located on the gate electrode. The thickness of the spacer 13 defines the spacing of the evacuated gap 2 (see distance D in FIG. 1). The spacer 13 is made of an electrically (and thermally) insulating material, like e.g. a ceramic. The integrated generator cell can be manufactured with techniques as known from the conventional semiconductor technology.

The effect of the magnetic field created in the gap 2 is schematically illustrated in FIG. 4A, which shows the gate electrode 31 with the electrode holes 34. The electron paths 3 run through the electrode holes 34 from the electron emitter to the electron collector (not shown). Under the effect of the magnetic field, the electrons 1 follow spiral paths 4, so that they predominantly fly through the electrode holes 34 of the gate electrode 31, not impinging onto the positively charged gate electrode 31. For avoiding a loss of electrons on the gate electrode 31, this can be provided with a shielding electrode 33 as described below with reference to FIG. 6C.

Figures 4B, 4C:
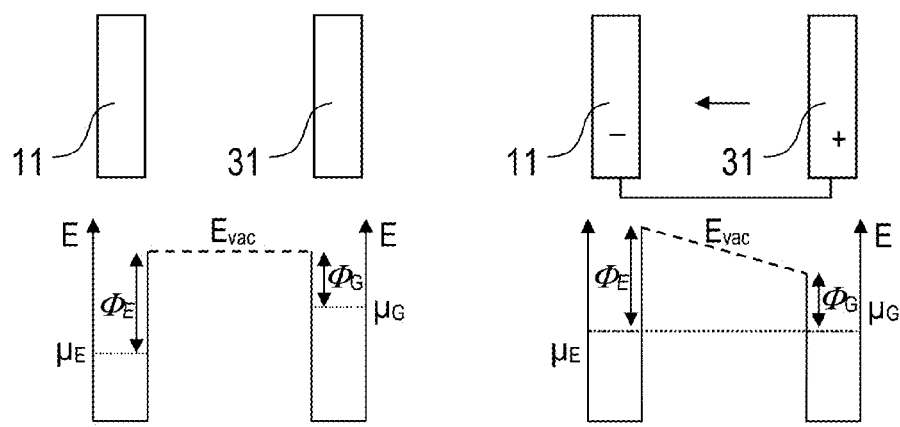

FIGS. 4B and 4C show the creation of the accelerating potential between the electron emitter 11 and the gate electrode 31 having different work functions of the emitter and gate materials. According to FIG. 4B, the electron emitter 11 has a work function $\Phi_E$ larger than the work function $\Phi_G$ of the gate electrode 31. When the electron emitter 11 and the gate electrode 31 are connected with each other (FIG. 4C), electrons move from the gate electrode 31 to the electron emitter 11 until the chemical potentials of the materials are equalized. Thus, the accelerating potential is generated between the electron emitter 11 and the gate electrode 31.

While the above embodiments illustrated the electron emitter with a plane surface 12, micro- or nano-structures 14 and/or a curved surface 12 of the electron emitter 11 can be provided as shown in FIGS. 5A and 5B, respectively. According to FIG. 5A, nano-tubes made of e.g. carbon are arranged for a field enhancement on the surface 12 of the electron emitter 11. According to FIG. 5B, the surface 12 has the shape of a semi-sphere facing to the semi-sphere shaped electron collector 21. In this case, the gate electrode 31 is provided with a semi-spherical shape as well. The electron collector 21 can have a curved shape as shown or a plane shape.

FIG. 6 shows variants of a gate electrode 31 with schematic top views (FIGS. 6A and 6B) or a perspective partial view (FIG. 6C). FIG. 6A illustrates the preferred two-dimensional honeycomb lattice structure, wherein the electrode holes 34 have a regular hexagonal shape. Alternatively, a linear lattice comprising straight lattice strips 37 can be provided as shown in FIG. 6B. FIG. 6C illustrates a sandwich structure of the gate electrode 31 with the example of the honeycomb lattice. The gate electrode 31 is provided with a shielding electrode 33, which is arranged on the side of the gate electrode 31 facing to the electron emitter 11 (see e.g. FIGS. 1 to 3). The shielding electrode 33 is electrically insulated relative to the gate electrode 31 by an insulating layer, made of e.g. a ceramic. The shielding electrode 33 is connected with an additional voltage source, which creates a negative voltage via the gate electrode 31, which forms a field barrier around the lattice strips 37. Accordingly, the electrons are forced to the electron paths 3 through the electrode hole 34.

Figure 7:
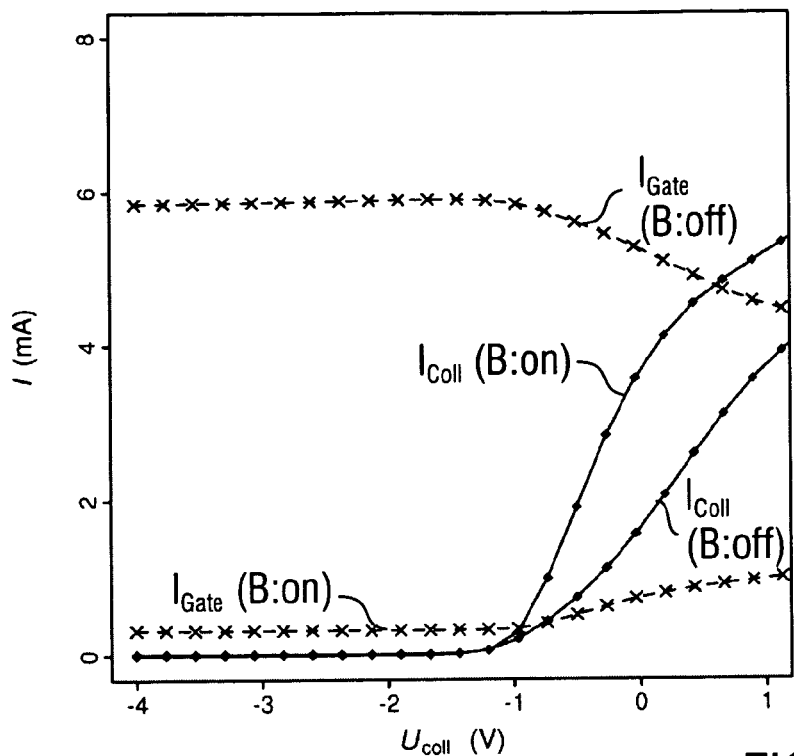
FIGS. 7 and 8: graphical representations of experimental results characterizing features of the inventive thermoelectronic energy converter device.
Figure 8:
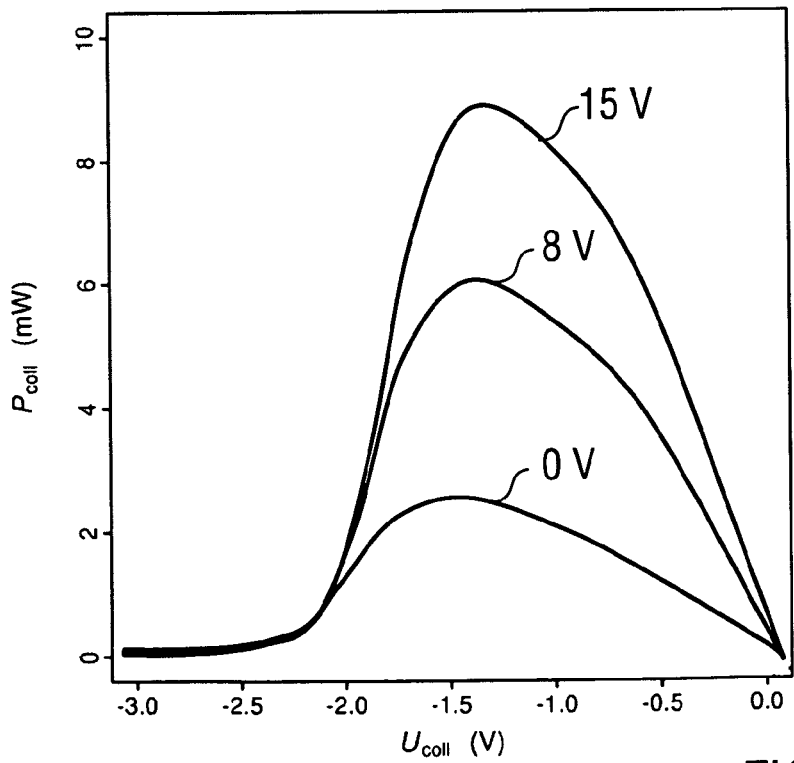

FIGS. 7 and 8 illustrate experimental results which have been obtained with the inventive design of the thermoelectronic generator device and confirmed with a practical demonstrator model thereof. FIG. 7 shows the measured current at the electron collector 21 ($I_{Coll}$) and at the gate electrode 31 ($I_{Gate}$) plotted as a function of the collector voltage ($U_{Coll}$) at the load circuitry 60 for an applied gate voltage $U_{Gate}$=6 V at the gate electrode 31 and an electron emitter temperature T=1100° C. Without magnetic field (B:off), the gate current is larger than the collector current for all collector voltages. With an applied magnetic field (B:on), the majority of the electrons pass through the gate electrode 31 and condense on the electron collector 21. Therefore, the collector current is larger than the gate current for $U_{coll}$>−1 V. FIG. 8 shows the measured generated power $P_{coll}$ displayed in dependency of the collector voltage $U_{coll}$ for several gate voltages 15 V, 8 V and 0 V. Accordingly, FIG. 8 shows the efficiency increasing effect of the gate electrode 31.

The features of the invention disclosed in the above description, the drawings and the claims can be of significance both individually as well as in combination for the realization of the invention in its various embodiments.

The invention claimed is:

1. A thermoelectronic energy converter device, comprising:
   an electron emitter being adapted for a temperature-dependent release of electrons,
   an electron collector being adapted for collecting the electrons, wherein the electron collector is spaced from the electron emitter by an evacuated gap,
   a gate electrode being arranged between the electron emitter and the electron collector for subjecting the electrons in the gap to an accelerating electric potential, and
   a magnetic field device being arranged for creating a magnetic field with magnetic field lines extending between the electron emitter and the electron collector, wherein
   the gate electrode has a plurality of electrode openings being arranged for transmitting electrons running from the electron emitter to the electron collector, and
   the magnetic field device is arranged such that at least a portion of the magnetic field lines pass through the electrode openings,
   wherein the thermoelectronic energy converter device comprises at least one of the features:
   a distance between the electron emitter and the electron collector is at least one of above 1μm and below 0.3 mm,
   a thickness of the gate electrode is below 300 μm,
   at least one of the electron emitter and the electron collector is made of at least one of a metal, a conducting oxide, a semiconductor, a diamondoid, LaB6, and an electride,
   at least one of the electron emitter and the electron collector is doped with a work function lowering dopand, and
   at least one of the electron emitter and the electron collector is coated with a work function lowering coating.

2. The thermoelectronic energy converter device according to claim 1, wherein
   the gate electrode is a single sheet of an electrically conducting material.

3. The thermoelectronic energy converter device according to claim 1, wherein
   the gate electrode has a regular lattice structure including the plurality of electrode openings.

4. The thermoelectronic energy converter device according to claim 1, wherein the electrode openings have a cross-sectional dimension being equal to or smaller than five times a width of a spacing between the electron emitter and the electron collector.

5. The thermoelectronic energy converter device according to claim 1, comprising at least one of the features
the distance between the electron emitter and the electron collector is at least one of above 10 µm and below 200 µm, and
the thickness of the gate electrode is below 250 µm.

6. The thermoelectronic energy converter device according to claim 1, further comprising
a cooling device being arranged for cooling the electron collector.

7. The thermoelectronic energy converter device according to claim 1, wherein
at least one of the electron emitter and the electron collector has a plane surface facing the gap.

8. The thermoelectronic energy converter device according to claim 1, wherein
at least one of the electron emitter and the electron collector has a curved surface facing the gap.

9. The thermoelectronic energy converter device according to claim 1, wherein
a tip structure distribution is formed on at least one of the electron emitter and the electron collector, wherein the tip structure distribution comprises at least one of micro-structures and nano-structures.

10. The thermoelectronic energy converter device according to claim 9, wherein
the tip structure distribution is formed on surface sections of at least one of the electron emitter and the electron collector aligned with the electrode openings of the gate electrode.

11. The thermoelectronic energy converter device according to claim 1, wherein
the gate electrode is electrically connected with a dc voltage source.

12. The thermoelectronic energy converter device according to claim 11, wherein
the dc voltage source is adapted for superimposing the dc voltage with an ac voltage modulation.

13. The thermoelectronic energy converter device according to claim 1, wherein
a work function of a material of the gate electrode is lower than a work function of a material of the electron emitter, and
the gate electrode is electrically connected with the electron emitter.

14. The thermoelectronic energy converter device according to claim 1, wherein
a load circuit is connected between the electron emitter and the electron collector,
the electron emitter is arranged for an application of at least one applied energy selected from the group consisting of thermal energy and radiation energy, and
the thermoelectronic energy converter device is configured for converting the applied energy to electric energy.

15. The thermoelectronic energy converter device according to claim 14, wherein
a thermal engine is connected with the electron collector.

16. A method of converting energy using the thermoelectronic energy converter device according to claim 1, comprising the steps of:
releasing electrons from the electron emitter,
accelerating the electrons released from the electron emitter by the accelerating electric potential in the gap through the electrode openings toward the electron collector,
subjecting the electrons released from the electron emitter to the magnetic field, wherein the magnetic field lines of the magnetic field pass through the electrode openings, and
collecting the electrons with the electron collector.

17. The method according to claim 16, further comprising
cooling the electron collector with a cooling device.

18. The method according to claim 16, wherein
the magnetic field is created with at least one of at least one permanent magnet and at least one electromagnet being arranged adjacent to or in a neighborhood of at least one of the electron emitter and the electron collector, respectively.

19. The method according to claim 18, wherein
the at least one electromagnet comprises at least one superconducting coil.

20. The method according to claim 16, further comprising at least one of
accelerating the electrons toward the electron collector with an auxiliary gate electrode, and
shielding a surface of the gate electrode facing at least one of to and from the electron emitter with a shielding electrode.

21. The method according to claim 16, wherein
the step of releasing the electrons from the electron emitter includes emitting electrons from at least one of micro- and nano-structures arranged on the electron emitter.

22. The method according to claim 16, wherein
the step of collecting the electrons at the electron collector includes collecting the electrons with at least one of micro- and nano-structures arranged on the electron collector.

23. The method according to claim 16, wherein
a dc voltage is applied to the gate electrode.

24. The method according to claim 23, wherein
the dc voltage is superimposed with an ac voltage modulation.

25. The method according to claim 16, wherein
a work function of a material of the gate electrode is lower than a work function of a material of the electron emitter,
the gate electrode is electrically connected with the electron emitter, and
the accelerating electric potential in the gap is created by a difference of the work functions of the materials of the gate electrode and the electron emitter.

26. The method according to claim 16, wherein
a load circuit is connected between the electron emitter and the electron collector,
at least one applied energy selected from the group consisting of thermal energy and radiation energy is applied to the electron emitter, and
the thermoelectronic energy converter device is used for converting the applied energy to electric energy, so that an electric current is created in the load circuit between the electron emitter and the electron collector.

27. The method according to claim 26, wherein
a thermal engine is connected with the electron collector.

28. The method according to claim 16, wherein
a power source is connected between the electron emitter and the electron collector, an electric voltage is applied between the electron emitter and the electron collector, and the thermoelectronic energy converter device is used for converting electric energy to thermal energy, wherein the electron emitter is cooled by the release of the electrons or the electron collector is heated by the collection of electrons in response to the application of the electric voltage.

29. The method according to claim 28, wherein the electron emitter is cooled by the release of the electrons and the electron collector is heated by the collection of electrons in response to the application of the electric voltage.

30. A thermooelectronic energy converter device, comprising:
an electron emitter being adapted for a temperature-dependent release of electrons,
an electron collector being adapted for collecting the electrons, wherein the electron collector is spaced from the electron emitter by an evacuated gap,
a gate electrode being arranged between the electron emitter and the electron collector for subjecting the electrons in the gap to an accelerating electric potential, and
a magnetic field device being arranged for creating a magnetic field with magnetic field lines extending between the electron emitter and the electron collector, wherein
the gate electrode has a plurality of electrode openings being arranged for transmitting electrons running from the electron emitter to the electron collector, and
the magnetic field device is arranged such that at least a portion of the magnetic field lines pass through the electrode openings, wherein
the gate electrode has a honeycomb lattice structure.

31. A thermoelectronic energy converter device, comprising:
an electron emitter being adapted for a temperature-dependent release of electrons,
an electron collector being adapted for collecting the electrons, wherein the electron collector is spaced from the electron emitter by an evacuated gap,
a gate electrode being arranged between the electron emitter and the electron collector for subjecting the electrons in the gap to an accelerating electric potential, and
a magnetic field device being arranged for creating a magnetic field with magnetic field lines extending between the electron emitter and the electron collector, wherein
the gate electrode has a plurality of electrode openings being arranged for transmitting electrons running from the electron emitter to electron collector, and
the magnetic field device is arranged such that at least a portion of the magnetic field lines pass through the electrode openings, wherein the magnetic field device includes at least one of the features:
the magnetic field device includes at least one of at least one permanent magnet and at least one electromagnet being arranged adjacent to or in a neighborhood of at least one of the electron emitter and the electron collector, respectively,
the magnetic field device includes a magnetic yoke being arranged for confining the magnetic field lines, and
the magnetic field device is adapted for creating the magnetic field with sections of increased field strength according to positions of the electrode openings.

32. The thermoelectronic energy converter device according to claim 31, wherein
the at least one electromagnet comprises at least one superconducting coil.

33. A thermoelectronic energy converter device, comprising:
an electron emitter being adapted for a temperature-dependent release of electrons,
an electron collector being adapted for collecting the eletrons, wherein the electron collector is spaced from the electron emitter by an evacuated gap,
a gate electrode being arranged between the electron emitter and the electron collector for subjecting the electrons in the gap to an accelerating electric potential, and
a magnetic field device being arranged for creating a magnetic field with magnetic field lines extending between the electron emitter and the electron collector, wherein
the gate electrode has a plurality of electrode opening being arranged for transmitting electronics running from the electron emitter to the electron collector, and
the magnetic field device is arranged such that at least a portion of the magnetic field lines pass through the electrode openings, wherein
the gate electrode is supported by the electron emitter or the electron collector, wherein the gate electrode is electrically insulated relative to the electron emitter or electron collector, respectively.

34. The thermoelectronic energy converter device according to claim 33, wherein
the gate electrode is electrically insulated relative to the electron emitter or electron collector by an insulator layer, and
the insulator layer has insulator openings aligned with the electrode openings.

35. The thermoelectronic energy converter device according to claim 33, wherein
the gate electrode and the insulator layer are deposit coatings formed on the electron emitter or the electron collector, respectively.

36. A thermoelectronic energy conveter device, comprising:
an electron emitter being adapted for a temperature-dependent release of electrons,
an electron colleter being adapted for collecting the electrons, wherein the electron collector is spaced from the electron emitter by an evacuated gap,
a gate electrode being arranged between the electron emitter and the electron collector for subjecting the electrons in the gap to an accelerating electric potential, and
a magnetic field device being arranged for creating a magnetic field with magnetic field lines extending between the electron emitter and the electron collector, wherein
the gate electrode has a plurality of electrode openings being arranged for transmitting electrons running from the electron emitter to the electron collector, and
the magnetic field device is arragned such that at least a portion of the magnetic field lines pass through the electrode openings, further comprising
at least one of at least one auxiliary gate electrode and at least one shielding electrode being arranged between the electron emitter and the electron collector.

37. The thermoelectronic energy converter device according to claim 36, comprising at least one of the features the at least one auxiliary gate electrode is arranged for creating an additional accelerating potential,
the at least one shielding electrode is arranged for shielding a surface of the gate electrode facing the electron emitter,
the at least one shielding electrode is arranged for shielding a surface of the gate electrode facing away from the electron emitter, and
the at least one shielding electrode is arranged for shielding inner walls of the electrode openings.

38. A thermoelectronic energy converter device, comprising:
an electron emitter being adapted for a temperature-dependent release of electrons,
an electron collector being adapted for collecting the electrons, wherein the electron collector is spaced from the electron emitter by an evacuated gap,
a gate electrode being arranged between the electron emitter and the electron collector for subjecting the electrons in the gap to an accelerating electric potential, and
a magnetic field device being arranged for creating a magnetic field with magnetic field lines extending between the electron emitter and the electron collector, wherein
the gate electrode has a plurality of electrode openings being arranged for transmitting electrons running from the electron emitter to the electron collector, and
the magentic field device is arranged such that at least a portion of the magnetic field lines pass through the electrode openings, wherein
the electron collector or the gate electrode carries a reflective layer being adapted for at least one of reflecting visible and thermal radiation back to the electron emitter.

39. A thermoelectronic energy converter device, comprising:
an electron emitter being adapted for a temperature-dependent release of electrons,
an electron collector being adapted for collecting the electrons, wherein the electron collector is spaced from the electon emitter by an evacuated gap,
a gate electrode being arranged between the electron emitter and the electron collector for subjecting the electrons in the gap to an accelerating electric potential, and
a magnetic field device being arranged for creating a magnetic field with magnetic field lines extending between the electron emitter and the electron collector, wherein
the gate electrode has a plurality of electrode openings being arranged for transmitting electrons running from the electron emitter to the electron collector, and
the magnetic field device is arranged such that at least a portion of the magnetic field lines pass through the electrode openings, wherein
a power source is connected between the electron emitter and the electron collector,
the electron emitter is arranged as a heat sink to be cooled by the release of the electrons or the electron collector is arranged as a heat source to be heated by the collection of the electrons, and
the thermoelectronic energy converter device is configured for converting electric energy to thermal energy.

40. The thermoelectronic energy converter device according to claim 39, wherein
the electron emitter is arranged as a heat sink to be cooled by the release of the electrons and the electron collector is arranged as a heat source to be heated by the collection of the electrons.

* * * * *